United States Patent
Fan et al.

(10) Patent No.: US 6,785,625 B1
(45) Date of Patent: Aug. 31, 2004

(54) CHARACTERIZING MULTI-PORT CASCADED NETWORKS

(75) Inventors: Jun Fan, Escondido, CA (US); Arthur R. Alexander, Valley Center, CA (US); James L. Knighten, Poway, CA (US); Norman W. Smith, San Marcos, CA (US)

(73) Assignee: NCR Corporation, Dayton, OH (US)

( * ) Notice: Subject to any disclaimer, the term of this patent is extended or adjusted under 35 U.S.C. 154(b) by 0 days.

(21) Appl. No.: 10/145,856

(22) Filed: May 14, 2002

(51) Int. Cl.$^7$ .................. G01R 27/28; G01R 31/14
(52) U.S. Cl. ............................................. 702/117
(58) Field of Search ........................ 702/117, 118, 702/109, 75, 76, 81, 121, 182; 324/601, 612, 637, 638

(56) References Cited

U.S. PATENT DOCUMENTS

| | | | |
|---|---|---|---|
| 6,665,628 B2 * | 12/2003 | Martens | 702/117 |
| 2003/0135344 A1 * | 7/2003 | Martens | 702/117 |

OTHER PUBLICATIONS

Robert J. Weber, "Introduction to Microwave Circuits, Radio Frequency and Design Applications," Chapter 2, Models, Modeling, and Characterization, The Institute of Electrical and Electronics Engineers, Inc., New York, pp. 12–27 (2001).

David M. Pozar, "Microwave Engineering," Second Edition, John Wiley & Sons, Inc., pp. 1–12 (1998).

* cited by examiner

Primary Examiner—Michael Nghiem
(74) Attorney, Agent, or Firm—Trop Pruner & Hu P.C.

(57) ABSTRACT

A test mechanism includes test equipment to measure frequency-domain data, such as scattering or S parameters. The S parameters are transformed to a different type of network parameters, such as transmission or T parameters. Contributions of test fixtures can be easily removed for the overall T-parameter matrix of a device under test connected in cascade with the test fixture. The test mechanism provides accurate measurement of a device under test represented by a multi-port (greater than two ports) network that is cascaded with another multi-port network representing the test fixture.

30 Claims, 3 Drawing Sheets

FIG. 1  PRIOR ART
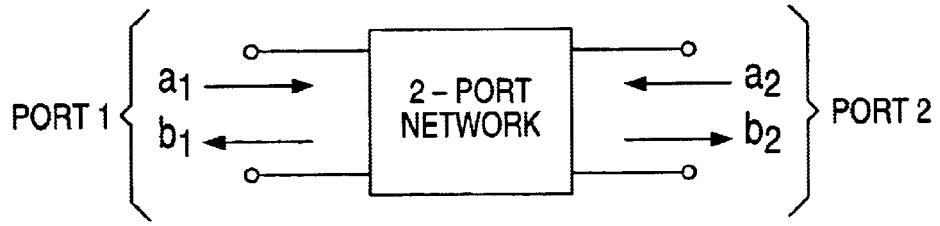
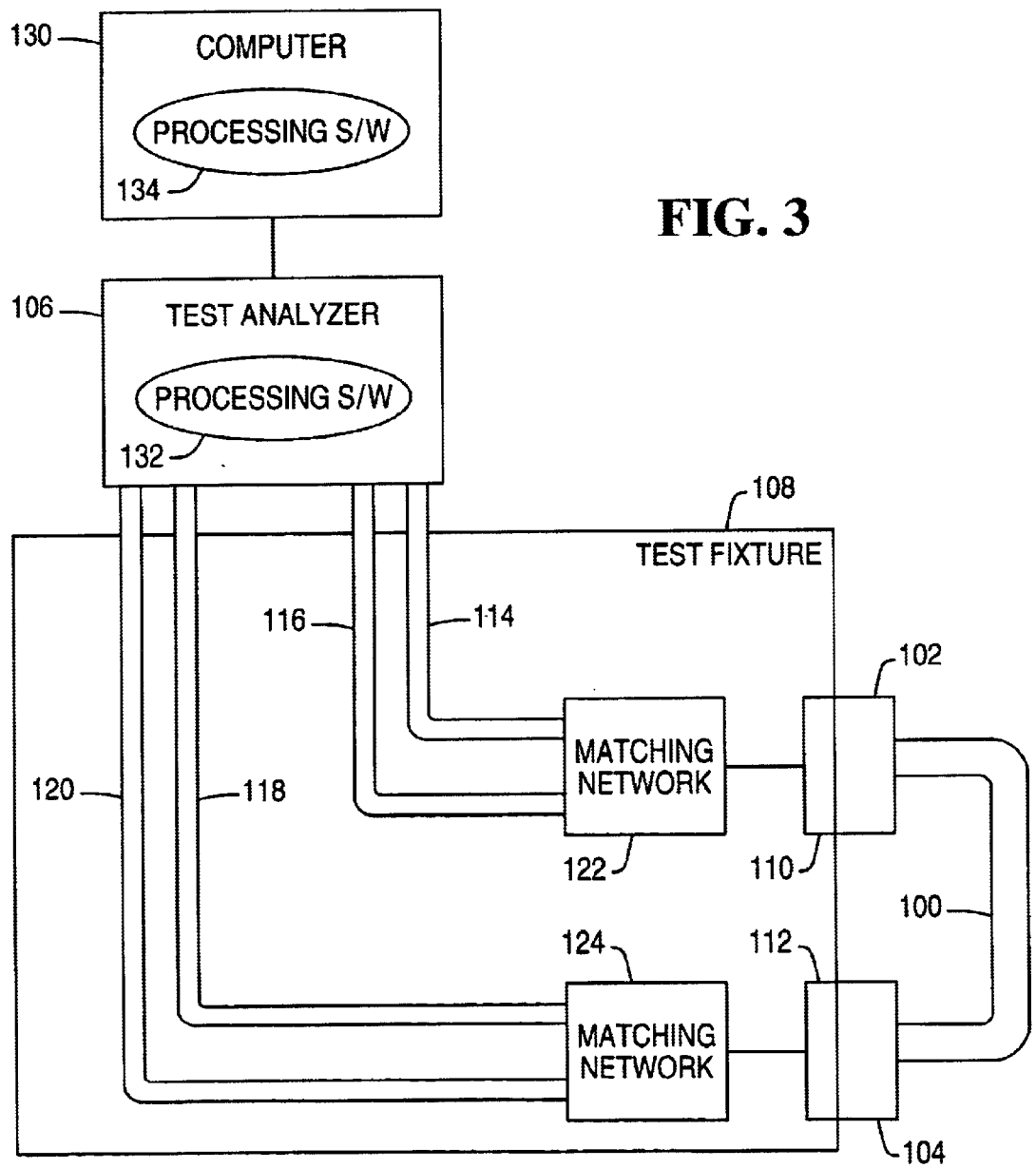
FIG. 3

CHARACTERIZING MULTI-PORT CASCADED NETWORKS

BACKGROUND

An electrical structure that has both an input and an output is represented as a linear two-port network or circuit. The input of the two-port circuit is assumed to be fed or sourced with a two-wire pair, and likewise, the output of the two-port circuit is loaded or terminated with a two-wire pair. The two-wire input pair and the two-wire output pair sometimes have a ground conductor in common.

At high frequencies, voltages and currents are derived from measurements of magnitude and phase of a signal wave traveling in a given direction. Thus, voltages and currents, and related impedance and admittance parameters, are not directly measurable. Instead, frequency-domain measurements, such as measurements of scattering or S parameters, are made with a network analyze, which is a type of test equipment. Once the scattering parameters of the network are known, conversion to other parameters, such as impedance or admittance parameters, can be performed if desired.

S parameters are discussed in relation with FIG. 1, which shows a two-port network having port 1 and port 2. The "a" parameter is a normalized incident wave (i.e., the wave that is input to a port) and the "b" parameter is a reflected wave (i.e., the wave is output from the port). The S parameters are dimensionless. Port 1 is associated with incident and reflected waves $a_1$, and $b_1$, while port 2 is associated with waves $a_2$ and $b_2$. The value $|a_1|^2$ represents the power incident on port 1, the value $|b_1|^2$ represents the power reflected from port 1, the value $|a_2|^2$ represents the power incident on port 2, and the value $|b_2|^2$ represents the power reflected from port 2.

Given the two-port network of FIG. 1, the relation between $a_1$, $a_2$, and $b_1$, $b_2$ is as follows:

$b_1 = S_{11}a_1 + S_{12}a_2$, and $b_2 = S_{21}a_1 + S_{22}a_2$.

More generally, the incident wave matrix [a] is related to the reflected wave matrix [b] by the scattering matrix [S]:

[b]=[S] [a].

A communications link may have multiple components, such as a coaxial cable, a connector, a board trace, and so forth. Each component of the communications link has its impact on the overall performance of the link. The components when connected in series can be treated as cascaded networks, with each network representing a corresponding component. While certain components can be tested directly by a network analyzer, testing of other components require the use of test fixtures if the network analyzer has test ports that may not adequately test such other of components.

A test fixture is usually a circuit board that is configured for testing a device under test (DUT), which can be one of the components of a communications link. When a test fixture is introduced, its contribution to the overall measurement made by the test equipment needs to be separated to accurately determine performance of the device under test. A limitation of S parameters is that separation of test fixture effects from the measured S-parameter data is a difficult task.

SUMMARY

An improved mechanism is provided for separating test fixture effects from measured scattering (or S) parameter data for multi-port networks. For example, a method of characterizing a device under test includes receiving measured frequency-domain parameters, such as scattering (or S) parameters, of a circuit including a test fixture and the device under test. The scattering parameters are transformed to a first set of further network parameters (such as transmission or T parameters). The effect of the test fixture is separated from the first set of T parameters to derive a second set of T parameters to represent performance of the device under test.

Other or alternative features will become apparent from the following description, from the drawings, and from the claims.

BRIEF DESCRIPTION OF THE DRAWINGS

FIG. 1 illustrates an example two-port network.

FIG. 3 illustrates a test arrangement that includes a network analyzer, a test fixture, and a device under test

DETAILED DESCRIPTION

In the following description, numerous details are set forth to provide an understanding of the present invention. However, it will be understood by those skilled in the art that the present invention may be practiced without these details and that numerous variations or modifications from the described embodiments may be possible.

Figure 2:
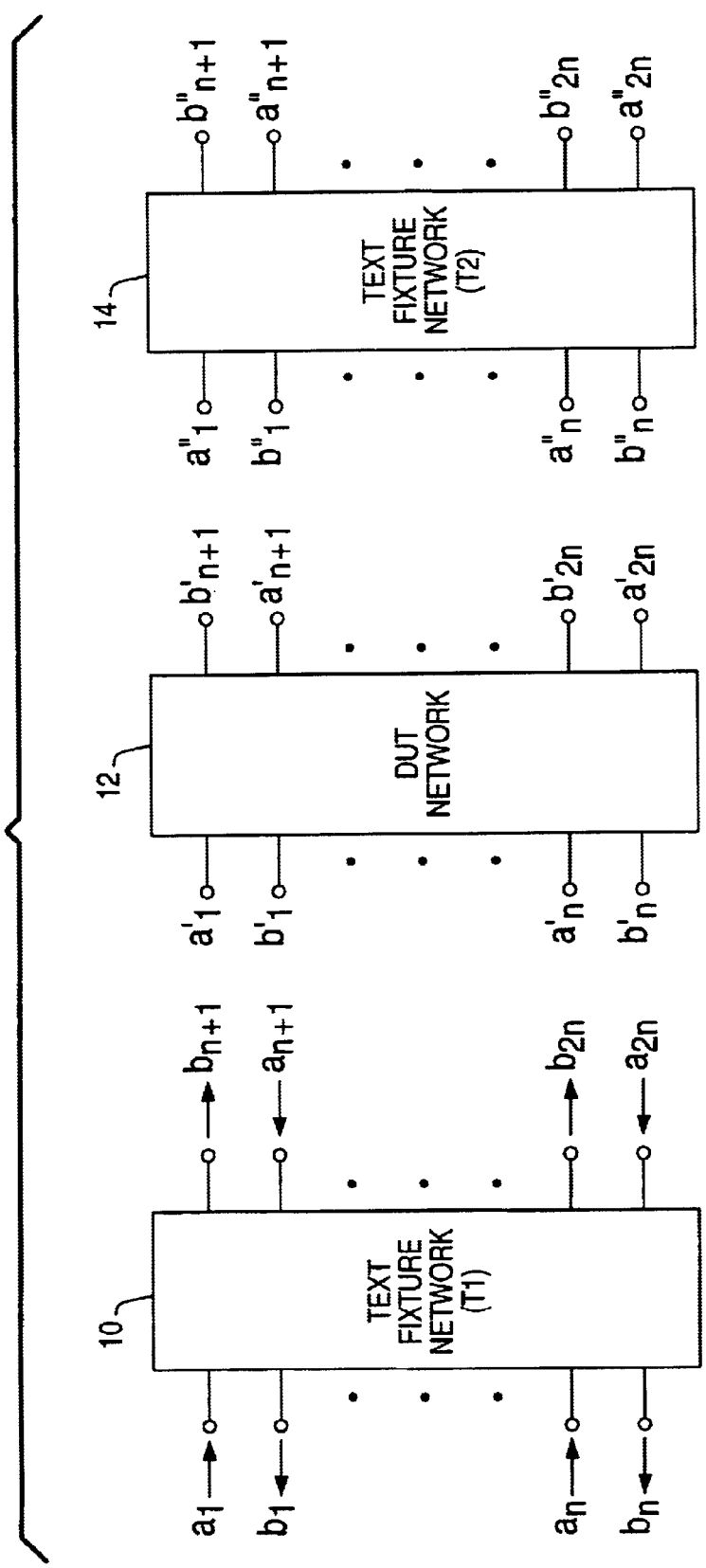
FIG. 2 illustrates a 2n-port network, where n is greater than one.

FIG. 2 shows 2n-port networks 10, 12, and 14 that are cascaded (or connected in series). A 2n-port network is a network with 2n ports. If n is greater than one, then the 2n-port network is one of a four-port network, eight-port network, and so forth. Such 2n-port networks are also referred to as multi-port networks.

The first 2n-port network 12 represents a device under test (DUT), while the 2n-port network 10 represents a first test fixture (T1) and the 2n-port network 14 represents a second test fixture (T2), both connected to the device under test. The first test fixture network 10 includes input ports 1 through n and output ports n+1 through 2n. Each port i has an incident wave $a_i$ and a reflected wave $b_i$. The second test fixture network 14 includes input ports 1 through n and output ports n+1 through 2n. Each port i of the second test fixture network 14 has an incident wave $a''_i$ and a reflected wave $b''_i$. Similarly, the DUT network 12 has input ports 1 through n and output ports n+1 through 2n. Each port i of the DUT network 12 has an incident wave $a'_i$ and a reflected wave $b'_i$. Test equipment supplies input signals to the cascaded networks 10, 12, and 14, and measures outputs of the cascaded networks 10, 12, and 14. In some embodiments, the measured data includes scattering or S parameters.

Although S parameters can be directly measured, such S parameters are not "chainable." In other words, for a circuit having multiple cascaded networks, each associated with its matrix of S parameters, the overall S parameter of the circuit is not a mere multiplication of matrices of the individual networks. As a result, removing effects of a test fixture from measured S parameters is not a straightforward task.

On the other hand, other types of network parameters can be chained. One such type of parameters includes transmission or transfer (T) parameters. In the cascaded network context of FIG. 2, a T-parameter matrix is defined for each of the networks 10, 12, and 14. An advantage of T parameters is that they are suitable for analyzing networks in cascade. However, unlike scattering or S parameters, T parameters cannot be directly measured by test equipment, such as a network analyzer. Therefore, in accordance with some embodiments of the invention, for cascaded $2n$-port networks, transformation between $2n$-port (n>1) S parameters and $2n$-port (n>1) T parameters is performed to enable contributions of a test fixture to be separated from measured S-parameter data Thus, generally, for S parameters measured for $2n$-port (n>1) networks, the measured S parameters are transformed into T parameters. Since the overall T-parameter matrix of cascaded networks is a matrix multiplication of the T-parameter matrix of each individual network, a matrix operation can be performed to remove the effects of the test fixture network 10 from the overall matrix of T parameters. This is performed by multiplying the overall T-parameter matrix by an inverse of the test fixture T-parameter matrix. Then, once the contribution of the test fixture T parameters is removed and the T-parameter matrix of the DUT network 12 is ascertained, another transformation is optionally performed to transform the T parameters of the DUT network 12 back to S parameters. Alternatively, the T parameters can be transformed to other network parameters, such as impedance parameters, admittance parameters, and so forth. In this way, a convenient technique is provided to separate contributions of a multi-port test fixture network from measured frequency-domain data.

T-parameter matrix $[T_{overall}]$ represents the T-parameter matrix for the cascaded networks 10, 12, and 14 shown in FIG. 2. The T-parameter matrix of the first test fixture network 10 is represented as [T1], the T-parameter matrix of the DUT network 12 is represented as [T'], and the T-parameter matrix of the second test fixture network 14 is represented as [T2]. The overall T-parameter matrix $[T_{overall}]$ is expressed by a simple matrix multiplication, according to the following equation:

$$[T_{overall}] = [T1][T'][T2].$$

The relation of the incident waves $a_i$ and reflected waves $b_i$ ($1 \leq i \leq 2n$) of the first test fixture network 10 is defined by the following equation:

$$\begin{bmatrix} a_1 \\ \vdots \\ a_n \\ b_1 \\ \vdots \\ b_n \end{bmatrix} = [T1] \begin{bmatrix} b_{n+1} \\ \vdots \\ b_{2n} \\ a_{n+1} \\ \vdots \\ a_{2n} \end{bmatrix}.$$

The relation of the incident waves $a'_i$ and reflected waves $b'_i$ ($1 \leq i \leq 2n$) of the DUT network 12 is represented by the following equation:

$$\begin{bmatrix} a'_1 \\ \vdots \\ a'_n \\ b'_1 \\ \vdots \\ b'_n \end{bmatrix} = [T'] \begin{bmatrix} b'_{n+1} \\ \vdots \\ b'_{2n} \\ a'_{n+1} \\ \vdots \\ a'_{2n} \end{bmatrix}.$$

The relation of incident waves $a''_i$ and reflected waves $b''_i$ ($1 \leq i \leq 2n$) of the second test fixture network 14 is represented by the following equation:

$$\begin{bmatrix} a''_1 \\ \vdots \\ a''_n \\ b''_1 \\ \vdots \\ b''_n \end{bmatrix} = [T2] \begin{bmatrix} b''_{n+1} \\ \vdots \\ b''_{2n} \\ a''_{n+1} \\ \vdots \\ a''_{2n} \end{bmatrix}.$$

From the above, the relation of the incident and reflected waves of the overall circuit including cascaded networks 10, 12, and 14 are expressed by the following equation:

$$\begin{bmatrix} a_1 \\ \vdots \\ a_n \\ b_1 \\ \vdots \\ b_n \end{bmatrix} = [T_{overall}] \begin{bmatrix} b''_{n+1} \\ \vdots \\ b''_{2n} \\ a''_{n+1} \\ \vdots \\ a''_{2n} \end{bmatrix}.$$

FIG. 3 shows a test arrangement for testing a device under test, which is a cable 100 in the illustrated example. The cable 100 is a four-port device in that it has two ports at the input and two ports at the output. In one example configuration, the cable 100 has at least three conductors: two signal conductors and one ground conductor. The three conductors form two signal pairs. A first signal pair is made up of a first signal conductor and the ground conductor, and the second signal pair is made up of a second signal conductor and ground conductor. The four-port cable is used to communicate differential signals.

In the example, the input of the cable 100 has a cable connector 102 and the output of the cable 100 has a cable connector 104. The designation of input and output can also be reversed. At the input, the combination of one signal conductor and the ground conductor makes up one port and the combination of the other signal conductor and the ground conductor makes up the other port. Similarly, at the output of the cable 100, the combination of one signal conductor and the ground conductor makes up one port and the combination of the other signal conductor and the ground conductor makes up the other port. Thus, with two ports at the input and two ports at the output, the device under test 100 is a four-port device.

Because the device under test 100 is a four-port device without standard coaxial connections, most test analyzers (such as a test analyzer 106 shown in FIG. 3) are not able to directly connect to the cable 100 for testing. As a result, a test fixture 108 is used, with the test fixture providing two connectors 110 and 112, with each connector having the necessary number of pins to connect to the three conductors in the cable 100. Coaxial cables 114, 116, 118, and 120 are connected to the test analyzer 106. Each of the coaxial cables 114, 116, 118, and 120 is a two-port device (with one signal conductor and one ground conductor). The test fixture 108 provides necessary electrical connections to connect the two-port cables 114, 116, 118, and 120 to the four-port cable 100. In some implementations, the test fixture 108 includes a circuit board with the appropriate signal traces and components.

Also, the characteristic impedance of the cables 100 may be different from the characteristic impedance of each of the cable 114, 116, 118, and 120. For example, the cable 100 may have a characteristic impedance of 75 ohms, while each of the cables 114, 116, 118, and 120 has a characteristic impedance of 50 ohms. In this case, matching circuits 122 and 124 are provided on the test fixture 108 to match the characteristic impedance of the cables 114, 116, 118, and 120 to the characteristic impedance of the device under test 100. The matching network 122 is connected between cables 114, 116 and the connector 100, while the matching network 124 is connected between the cables 118, 120 and the connector 112.

In the context of FIG. 2, the first test fixture network 10 includes the matching network 122, connector 110, and cable connector 102, while the second test fixture network 14 includes the matching network 124, connector 112, and cable connector 104. The test fixture 108 thus includes two four-port test fixture networks connected to the DUT.

Figure 4:
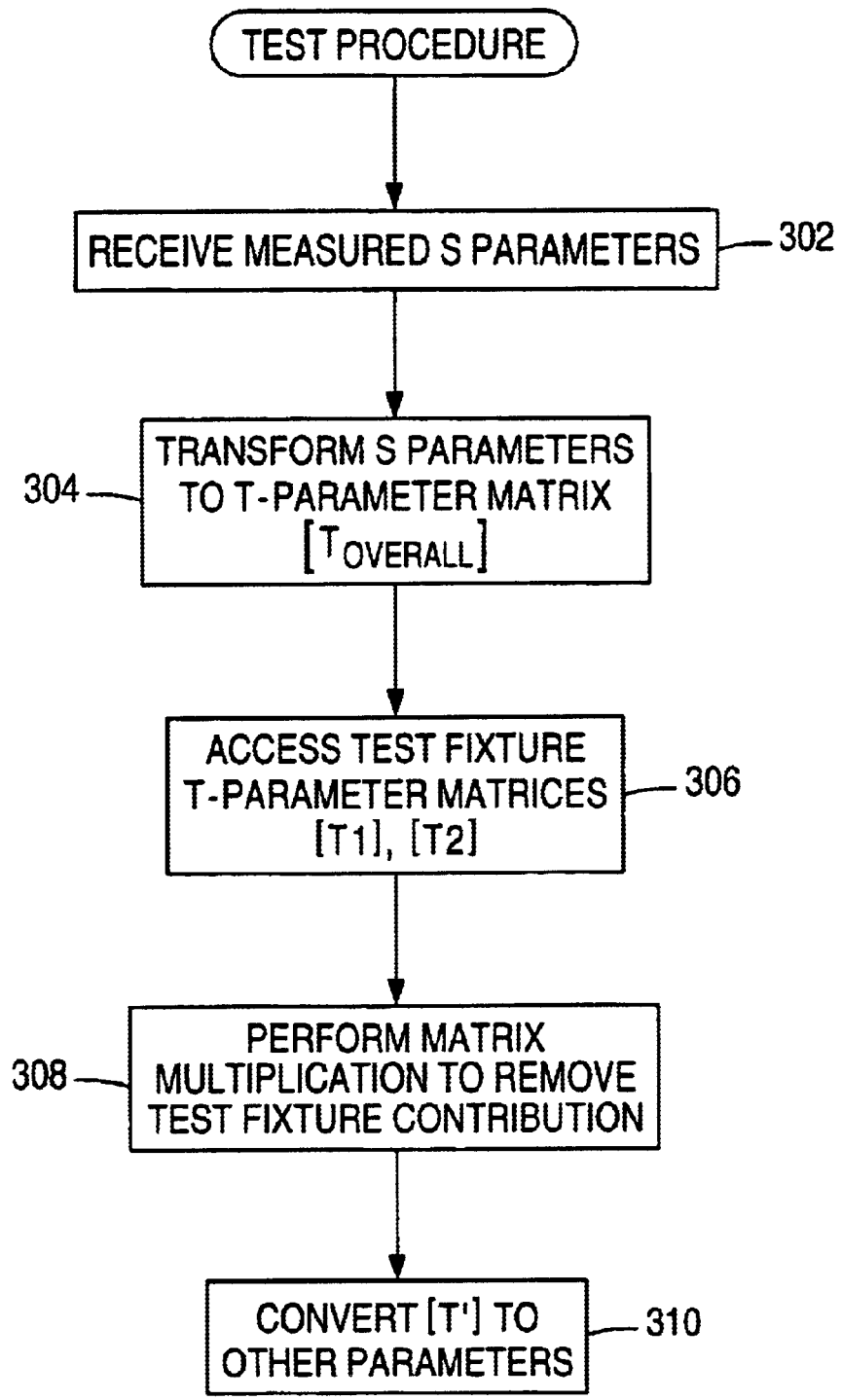
FIG. 4 is a flow diagram of a procedure according to one embodiment for separating effects of the test fixture from measured frequency-domain parameters, such as scattering parameters.

FIG. 4 shows a general procedure that is performed by DUT characterizing software 134 in a computer 130 coupled to the test analyzer 106. In an alternative embodiment, the procedure is performed by DUT characterizing software 132 in the test analyzer 106. The computer 130 is part of a test system that also includes the test analyzer 106.

The test analyzer 106 measures S parameters of the overall circuit, which includes a first $2n$-port network 12 representing the device under test and two $2n$-port networks 10 and 14 representing the test fixture. The measured S parameters are communicated to and received by (at 302) the DUT characterizing software 134 or 132.

In one implementation, the measured S-parameter data is provided to the DUT characterizing software in a text file or in another format. The DUT characterizing software transforms (at 304) the S parameter to T parameters. The transformed T parameters are contained in an overall T-parameter matrix $[T_{overall}]$. The T-parameter matrices $[T1]$ and $[T2]$ of the test fixture $2n$-port networks 10 and 14, which are known and stored, are then accessed (at 306) by the DUT characterizing software.

The characterizing software next performs (at 308) matrix multiplication to remove the contribution of the test fixture $2n$-port networks from the overall T-parameter matrix $[T_{overall}]$. The matrix multiplication is as follows:

$$[T']=[T1]^{-1}[T_{overall}][T2]^{-1}.$$

$[T1]^{-1}$ represents the inverse of the test fixture T-parameter matrix $[T1]$, and $[T2]^{-1}$ represents the inverse of the test fixture T-parameter matrix $[T2]$. The resultant T-parameter matrix $[T']$ represents the T parameters of the device under test. If desired, the T-parameter matrix $[T']$ of the device under test is converted (at 310) to other network parameters, such as back to S parameters or to other types of network parameters.

By using techniques according to some embodiments, high-speed differential signal links, which are represented as $2n$-port networks (n>1), can be evaluated by using frequency-domain measurements (such as S-parameter measurements). A straightforward yet reliable technique is provide to remove, or de-embed, effects of a test fixture from the measured frequency-domain data.

The relations between T parameters and S parameters are discussed below. For the $2n$-port cascaded networks 10, 12, and 14 shown in FIG. 2, the multi-port S parameters relate the reflected and incident waves as follows:

$$\begin{bmatrix} b_1'' \\ \vdots \\ b_n'' \\ b_{n+1}'' \\ \vdots \\ b_{2n}'' \end{bmatrix} = \begin{bmatrix} S_{11} & \cdots & S_{1n} & S_{1,n+1} & \cdots & S_{1,2n} \\ \vdots & \ddots & \vdots & \vdots & \ddots & \vdots \\ S_{n1} & \cdots & S_{nn} & S_{n,n+1} & \cdots & S_{n,2n} \\ S_{n+1,1} & \cdots & S_{n+1,n} & S_{n+1,n+1} & \cdots & S_{n+1,2n} \\ \vdots & \ddots & \vdots & \vdots & \ddots & \vdots \\ S_{2n,1} & \cdots & S_{2n,n} & S_{2n,n+1} & \cdots & S_{2n,2n} \end{bmatrix} \begin{bmatrix} a_1 \\ \vdots \\ a_n \\ a_{n+1} \\ \vdots \\ a_{2n} \end{bmatrix}.$$

Sub-matrices [A], [B], [C], and [D] of the S-parameter matrix above are defined as follows:

$$[A] = \begin{bmatrix} S_{11} & \cdots & S_{1n} \\ \vdots & \ddots & \vdots \\ S_{n1} & \cdots & S_{nn} \end{bmatrix},$$

$$[B] = \begin{bmatrix} S_{1,n+1} & \cdots & S_{1,2n} \\ \vdots & \ddots & \vdots \\ S_{n,n+1} & \cdots & S_{n,2n} \end{bmatrix},$$

$$[C] = \begin{bmatrix} S_{n+1,1} & \cdots & S_{n+1,n} \\ \vdots & \ddots & \vdots \\ S_{2n,1} & \cdots & S_{2n,n} \end{bmatrix},$$

$$[D] = \begin{bmatrix} S_{n+1,n+1} & \cdots & S_{n+1,2n} \\ \vdots & \ddots & \vdots \\ S_{2n,n+1} & \cdots & S_{2n,2n} \end{bmatrix},$$

From the above, the following equation is derived:

$$\begin{bmatrix} a_1 \\ \vdots \\ a_n \\ b_1'' \\ \vdots \\ b_n'' \end{bmatrix} = \begin{bmatrix} C^{-1} & -C^{-1}D \\ AC^{-1} & B-AC^{-1}D \end{bmatrix} \begin{bmatrix} b_{n+1}'' \\ \vdots \\ b_{2n}'' \\ a_{n+1} \\ \vdots \\ a_{2n} \end{bmatrix},$$

From this, it can be determined that the T-parameter matrix $[T_{overall}]$ of the cascaded networks is expressed as follows:

$$[T_{overall}] = \begin{bmatrix} C^{-1} & -C^{-1}D \\ AC^{-1} & B-AC^{-1}D \end{bmatrix},$$

Thus, from the measured S-parameter matrix that contains sub-matrices [A], [B], [C], and [D], the T-parameter matrix $[T_{overall}]$ can be derived. Once $[T_{overall}]$ is known, matrix multiplication is performed as follows to remove the effect of the test fixture:

$$[T']=[T1]^{-1}[T_{overall}][T2]^{-1}.$$

The following defines the relation of incident and reflected waves by the T-parameter matrix $[T']$ of the device under test:

$$\begin{bmatrix} a'_1 \\ \vdots \\ a'_n \\ b'_1 \\ \vdots \\ b'_n \end{bmatrix} = \begin{bmatrix} T_{11} & \cdots & T_{1n} & T_{1,n+1} & \cdots & T_{1,2n} \\ \vdots & \ddots & \vdots & \vdots & \ddots & \vdots \\ T_{n1} & \cdots & T_{nn} & T_{n,n+1} & \cdots & T_{n,2n} \\ T_{n+1,1} & \cdots & T_{n+1,n} & T_{n+1,n+1} & \cdots & T_{n+1,2n} \\ \vdots & \ddots & \vdots & \vdots & \ddots & \vdots \\ T_{2n,1} & \cdots & T_{2n,n} & T_{2n,n+1} & \cdots & T_{2n,2n} \end{bmatrix} \begin{bmatrix} b'_{n+1} \\ \vdots \\ b'_{2n} \\ a'_{n+1} \\ \vdots \\ a'_{2n} \end{bmatrix}.$$

The following sub-matrices of the above T-parameters matrix are defined:

$$[\tilde{A}] = \begin{bmatrix} T_{11} & \cdots & T_{1n} \\ \vdots & \ddots & \vdots \\ T_{n1} & \cdots & T_{nn} \end{bmatrix},$$

$$[\tilde{B}] = \begin{bmatrix} T_{1,n+1} & \cdots & T_{1,2n} \\ \vdots & \ddots & \vdots \\ T_{n,n+1} & \cdots & T_{n,2n} \end{bmatrix},$$

$$[\tilde{C}] = \begin{bmatrix} T_{n+1,1} & \cdots & T_{n+1,n} \\ \vdots & \ddots & \vdots \\ T_{2n,1} & \cdots & T_{2n,n} \end{bmatrix},$$

$$[\tilde{D}] = \begin{bmatrix} T_{n+1,n+1} & \cdots & T_{n+1,2n} \\ \vdots & \ddots & \vdots \\ T_{2n,n+1} & \cdots & T_{2n,2n} \end{bmatrix},$$

From the above, the following relation can be derived:

$$\begin{bmatrix} b'_1 \\ \vdots \\ b'_n \\ b'_{n+1} \\ \vdots \\ b'_{2n} \end{bmatrix} = \begin{bmatrix} \tilde{C}\tilde{A}^{-1} & \tilde{D} - \tilde{C}\tilde{A}^{-1}\tilde{B} \\ \tilde{A}^{-1} & -\tilde{A}^{-1}\tilde{B} \end{bmatrix} \begin{bmatrix} a'_1 \\ \vdots \\ a'_n \\ a'_{n+1} \\ \vdots \\ a'_{2n} \end{bmatrix}.$$

From this, it can be determined that the S-parameter matrix [S'] of the device under test is expressed as follows:

$$[S'] = \begin{bmatrix} \tilde{C}\tilde{A}^{-1} & \tilde{D} - \tilde{C}\tilde{A}^{-1}\tilde{B} \\ \tilde{A}^{-1} & -\tilde{A}^{-1}\tilde{B} \end{bmatrix}.$$

Thus, once the T-parameter matrix [T] of the device under test is derived, after removing the effect of the test fixture, transformation back to an S-parameter matrix is performed as provided by the equation above.

Instructions of the various software routines or modules discussed herein (such as the DUT characterization software 132 or 134) are stored on one or more storage devices in the corresponding systems and loaded for execution on corresponding control units or processors. The control units or processors include microprocessors, microcontrollers, processor modules or subsystems (including one or more microprocessors or microcontrollers), or other control or computing devices. As used here, a "controller" refers to hardware, software, or a combination thereof. A "controller" can refer to a single component or to plural components (whether software or hardware).

Data and instructions (of the various software routines or modules) are stored in respective storage devices, which are implemented as one or more machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; and optical media such as compact disks (CDs) or digital video disks (DVDs).

While the invention has been disclosed with respect to a limited number of embodiments, those skilled in the art will appreciate numerous modifications and variations therefrom. It is intended that the appended claims cover such modifications and variations that fall within the true spirit and scope of the invention.

What is claimed is:

1. A method of characterizing a device under test, comprising:
   receiving measured scattering parameters of a circuit including a test fixture and the device under test, each of the test fixture and device under test represented as a multi-port network having greater than two ports;
   transforming the scattering parameters to a first set of further network parameters, the further network parameters being different from the scattering parameters; and
   separating an effect of the test fixture from the first set of further network parameters to derive a second set of further network parameters to represent performance of the device under test.

2. The method of claim 1, wherein transforming the scattering parameters to the first set of further network parameters comprises transforming the scattering parameters to a first set of transmission parameters.

3. The method of claim 2, wherein the first set of transmission parameters comprises a first matrix of transmission parameters, and wherein the second set of further parameters comprises a second matrix of transmission parameters, the method further comprising:
   storing a third matrix of transmission parameters representing the test fixture; and
   performing matrix multiplication of the first matrix of transmission parameters by an inverse of the third matrix of transmission parameters to derive the second matrix of transmission parameters.

4. The method of claim 1, wherein each multi-port network includes a 2n-port network, with n greater than one, wherein receiving the measured scattering parameters comprises receiving the measured scattering parameters of cascaded 2n-port networks.

5. The method of claim 4, wherein transforming the scattering parameters comprises transforming the scattering parameters to a first matrix of transmission parameters, the method further comprising:
   storing a second matrix of transmission parameters corresponding to the test fixture; and
   using the second matrix of transmission parameters to remove an effect of the test fixture from the first matrix of transmission parameters.

6. The method of claim 5, further comprising deriving a third matrix of transmission parameters to represent operation of the device under test.

7. The method of claim 1, wherein the device under test comprises a cable, and
   wherein deriving the second set of further network parameters comprises deriving the second set of further network parameters for the cable.

8. The method of claim 1, further comprising transforming the second set of the farther network parameters to scattering parameters representing performance of the device under test.

9. The method of claim 1, further comprising transforming the second set of further network parameters to other network parameters.

10. The method of claim 1, wherein the receiving, transferring, and separating are performed by a computer.

11. The method of claim 10, comprising the computer receiving the measured scattering parameters from test equipment.

12. A method of characterizing a device under test, comprising:
receiving measured scattering parameters of a circuit including a test fixture and the device under test, each of the test fixture and device under test represented as a multi-port network having greater than two ports;
transforming the scattering parameters to a first set of further network parameters, the further network parameters being different from the scattering parameters;
separating an effect of the test fixture from the first set of further network parameters to derive a second set of further network parameters to represent performance of the device under test,
wherein transforming the scattering parameters to further network parameters comprises transforming the scattering parameters to transmission parameters, wherein the first set of transmission parameters comprises a first matrix of transmission parameters, and wherein the second set of transmission parameters comprises a second matrix of transmission parameters;
storing a third matrix of transmission parameters representing the test fixture; and
performing matrix multiplication of the first matrix of transmission parameters by an inverse of the third matrix of transmission parameters to derive the second matrix of transmission parameters,
wherein the third matrix represents one portion of the test fixture;
storing a fourth matrix of transmission parameters representing another portion of the test fixture connected to the device under test; and
performing further matrix multiplication of the first matrix of transmission parameters by an inverse of the fourth matrix to derive the second matrix.

13. A test system comprising:
a storage to store a first set of first network parameters to represent a test fixture; and
a controller adapted to:
receive a set of measured frequency-domain parameters for a circuit having the test fixture and a device under test, the frequency-domain parameters being of a different type than the first network parameters, and each of the test fixture and device under test being a multi-port network having greater than two ports;
transform the set of measured frequency-domain parameters to a second set of first network parameters; and
use the first set of first network parameters to remove a contribution of the test fixture from the second set of first network parameters.

14. The test system of claim 13, wherein the first network parameters comprise transmission parameters.

15. The test system of claim 14, wherein the measured frequency-domain parameters comprise scattering parameters.

16. The test system of claim 15, wherein the first set of transmission parameters comprises a first matrix of transmission parameters, and the second set of transmission parameters comprises a second matrix of transmission parameters,
the controller to perform matrix multiplication of the second matrix by an inverse of the first matrix to remove the contribution of the test fixture.

17. The test system of claim 13, wherein each of the multi-port network comprises a $2n$-port network, with n greater than one.

18. An article comprising at least one storage medium containing instructions that when executed cause a test system to:
store a first matrix of transmission parameters corresponding to a test fixture;
receive measured data containing a matrix of scattering parameters corresponding to cascaded plural multi-port networks, one of the plural multi-port networks comprising the test fixture, and another one of the plural multi-port networks comprising a device under test, each multi-port network having greater than two ports;
transform the matrix of scattering parameters to a second matrix of transmission parameters; and
combine the second matrix with the first matrix to remove an effect of test fixture from the measured data.

19. The article of claim 18, wherein the instructions when executed cause the test system to derive a third matrix of transmission parameters based on combining the first and second matrices.

20. The article of claim 19, wherein the instructions when executed cause the test system to combine the first and second matrices by multiplying the second matrix by an inverse of the first matrix.

21. An article comprising at least one storage medium containing instructions that when executed cause a test system to:
store a first matrix of transmission parameters corresponding to a test fixture;
receive measured data containing a matrix of scattering parameters corresponding to cascaded plural multi-port networks, one of the plural multi-port networks comprising the test fixture, and another one of the plural multi-port networks comprising a device under test, each multi-port network having greater than two ports;
transform the matrix of scattering parameters to a second matrix of transmission parameters;
combine the second matrix with the first matrix to remove an effect of test fixture from the measured data;
derive a third matrix of transmission parameters based on combining the first and second matrices; and
transform the third matrix of transmission parameters to another type of network parameters.

22. An article comprising at least one storage medium containing instructions that when executed cause a test system to:
store a first matrix of transmission parameters corresponding to a test fixture;
receive measured data containing a matrix of scattering parameters corresponding to cascaded plural multi-port networks, one of the plural multi-port networks comprising the test fixture, and another one of the plural multi-port networks comprising a device under test, each multi-port network having greater than two ports;
transform the matrix of scattering parameters to a second matrix of transmission parameters;

combine the second matrix with the first matrix to remove an effect of test fixture from the measured data;

derive a third matrix of transmission parameters based on combining the first and second matrices; and transform the third matrix of transmission parameters to another matrix of scattering parameters to represent the device under test.

23. A method of characterizing a device under test in a test arrangement in which the device under test is coupled through a test fixture to test equipment, each of the device under test and test fixture comprising a multi-port network with greater than two ports, the method comprising:

storing a first matrix of transmission parameters for the test fixture;

receiving measured scattering parameters of cascaded multi-port networks including the device under test network and test fixture network;

transforming the measured scattering parameters to a second matrix of transmission parameters; and performing a multiplication of the second matrix by an inverse of the first matrix to derive a third matrix of transmission parameters representing the device under test.

24. A method of characterizing a device under test, comprising:

receiving measured scattering parameters of a circuit including a test fixture and the device under test, each of the test fixture and device under test represented as a multi-port network having greater than four ports;

transforming the scattering parameters to a first set of further network parameters, the further network parameters being different from the scattering parameters; and separating an effect of the test fixture from the first set of further network parameters to derive a second set of further network parameters to represent performance of the device under test.

25. The method of claim 24, wherein transforming the scattering parameters to the first set of further network parameters comprises transforming the scattering parameters to a first set of transmission parameters.

26. The method of claim 25, wherein the first set of transmission parameters comprises a first matrix of transmission parameters, and wherein the second set of further parameters comprises a second matrix of transmission parameters, the method further comprising:

storing a third matrix of transmission parameters representing the test fixture; and performing matrix multiplication of the first matrix of transmission parameters by an inverse of the third matrix of transmission parameters to derive the second matrix of transmission parameters.

27. A test system comprising:

a storage to store a first set of first network parameters to represent a test fixture; and a controller adapted to:

receive a set of measured frequency-domain parameters for a circuit having the test fixture and a device under test, the frequency-domain parameters being of a different type than the first network parameters, and each of the test fixture and device under test being a multi-port network having greater than four ports;

transform the set of measured frequency-domain parameters to a second set of first network parameters; and use the first set of first network parameters to remove a contribution of the test fixture from the second set of first network parameters.

28. The test system of claim 27, wherein the first network parameters comprise transmission parameters.

29. The test system of claim 28, wherein the measured frequency-domain parameters comprise scattering parameters.

30. The test system of claim 29, wherein the first set of transmission parameters comprises a first matrix of transmission parameters, and the second set of transmission parameters comprises a second matrix of transmission parameters, the controller to perform matrix multiplication of the second matrix by an inverse of the first matrix to remove the contribution of the test fixture.

* * * * *